(12) United States Patent
Fan et al.

(10) Patent No.: US 7,618,263 B2
(45) Date of Patent: Nov. 17, 2009

(54) ELECTRICAL CONNECTOR HAVING HYBRID STANDOFF

(75) Inventors: Chia-Wei Fan, Tu-cheng (TW);
Nan-Hung Lin, Tu-cheng (TW);
Hao-Yun Ma, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/215,572

(22) Filed: Jun. 26, 2008

(65) Prior Publication Data

US 2009/0004903 A1    Jan. 1, 2009

(51) Int. Cl.
*H01R 12/00* (2006.01)
(52) U.S. Cl. .......................................... 439/71
(58) Field of Classification Search ................... 439/71, 439/73, 331, 525, 526
See application file for complete search history.

(56) References Cited

U.S. PATENT DOCUMENTS

| | | | |
|---|---|---|---|
| 4,504,105 A | 3/1985 | Barkus et al. | |
| 5,344,334 A | 9/1994 | Laub et al. | |
| 7,044,746 B2 | 5/2006 | Copper et al. | |
| 7,083,430 B2 * | 8/2006 | Liao et al. ................. | 439/73 |
| 7,252,517 B2 * | 8/2007 | Ju ............................... | 439/73 |
| 7,491,082 B2 * | 2/2009 | Hsu et al. ................... | 439/330 |
| 2005/0042897 A1 * | 2/2005 | Zhang et al. ............... | 439/71 |

FOREIGN PATENT DOCUMENTS

CN    2891336 Y    4/2007

* cited by examiner

*Primary Examiner*—Gary F. Paumen
(74) *Attorney, Agent, or Firm*—Andrew C. Cheng; Wei Te Chung; Ming Chieh Cheng

(57) ABSTRACT

The present invention provides an electrical connector for establishing electrical connection between an IC module and a PCB. The electrical connector comprises an insulative housing and a set of electrical contacts received in the housing. The insulative housing has a mating surface and a mounting surface opposite thereto. The mating surface defines a supporting block extending upwardly thereof for supporting an IC module when said IC module is mated with the electrical connector. A reinforced element is defined in the supporting block, so as to reinforce said supporting block.

14 Claims, 8 Drawing Sheets

ELECTRICAL CONNECTOR HAVING HYBRID STANDOFF

BACKGROUND OF THE INVENTION

1. Field of the Invention

Generally, the present invention relates to the art of electrical connectors. Specially, the present invention provides an electrical connector that comprises hybrid standoffs for supporting an Intergraded circuit (IC) module when said IC module is mounted in the electrical connector under an external force.

2. Background of the Invention

Land Grid Array (LGA) electrical connectors are widely used in the art of electron for electrically connecting an IC module to a Printed Circuit Board (PCB). Such arts have been disclosed in "Nonlinear Analysis Helps Design LGA Connectors" (Connector Specifier, February 2001). Some typical LGA connectors generally comprise an insulative housing embedded with a number of contacts, which are also disclosed by U.S. Pat. Nos. 4,504,105; 5,344,334 and 7,044,746.

Chinese Patent No. 2891336 discloses a LGA electrical connector relating to the present invention. The LGA electrical connector comprises an insulative housing embedded with a number of contacts. The insulative housing has a conductive region formed by peripheral walls for supporting an IC module, and a number of contact receiving passageways are formed in the conductive region for receiving corresponding contacts. The conductive region also has an upper plane for mating with said IC module. At least one positioning standoff is arranged between the conductive regions and said peripheral walls, which is used for supporting said IC module so as to distribute the pressure from the IC module and prevent the contact from excessive deformation under said pressure. In another word, the at least one positioning standoff acts a role of an auxiliary supporting member.

However, in the depicted conventional electrical connectors, said positioning standoffs are usually integrally molded with the insulative housing by an injected art.

Thus, when the connector is formed, contacts are inserted in a column-row configuration on the housing of the electrical connector. In addition, when the industry trend is to obtain highest quantity of contacts on the electrical connector, a larger external force is needed to provide an enough pressure ensuring proper mate between the IC and the insulative housing. Under that condition, the plastic standoff will be damaged because of its limited strength, further making the contacts under a larger pressure than designed. As a result, risk of shorting of the contacts is increased.

In view of the foregoing, there exists a need for an electrical connector having a better positioning manner for supporting the IC module.

SUMMARY OF THE INVENTION

Accordingly, an object of the present invention is to provide an electrical connector for increasing the strength of the positing standoff.

To achieve the above-mentioned object, in a preferred embodiment of the present invention, the present invention provides an electrical connector for establishing electrical connection between an IC module and a PCB. The electrical connector comprises an insulative housing and a set of electrical contacts received in the housing.

The insulative housing has a mating surface and a mounting surface opposite thereto. The mating surface defines a supporting block extending upwardly thereof for supporting an IC module when said IC module is mated with the electrical connector. A reinforced element is defined in the supporting block, so as to reinforce said supporting block. The reinforced element may be disposed either above or not above the supporting block.

By forming the electrical connector in the above manner, an electrical connector having a reinforced supporting member for supporting an IC module is available.

BRIEF DESCRIPTION OF THE DRAFLANGES

DETAILED DESCRIPTION OF THE PREFERRED EMBODIMENT OF THE INVENTION

A first preferred embodiment of the present invention will be described hereunder with reference to the accompanying drawings FIG. 1-FIG. 3.

Figure 1:
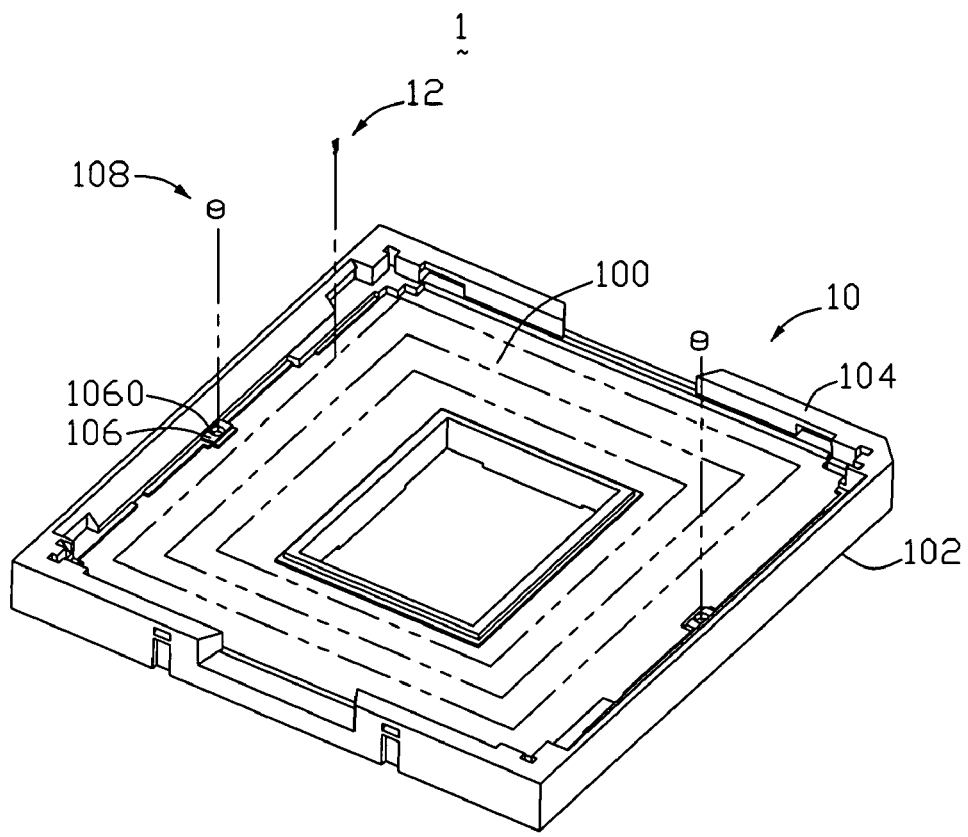
FIG. 1 is an exploded, perspective view of an electrical connector in accordance with a first preferred embodiment of the present invention.
Figure 2:
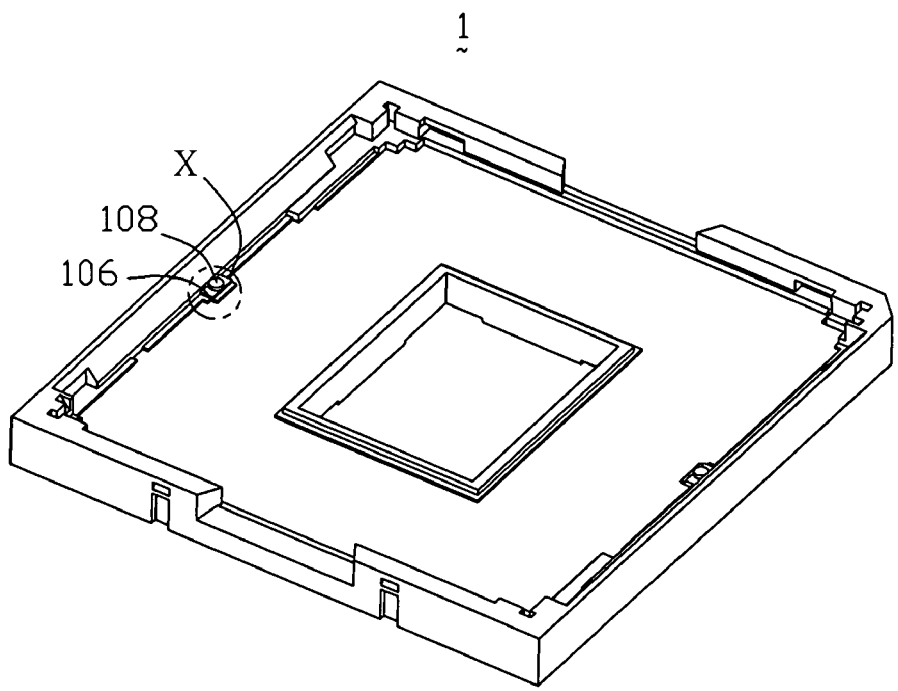
FIG. 2 is an assembled view of an electrical connector in accordance with a first preferred embodiment of the present invention.
Figure 3:
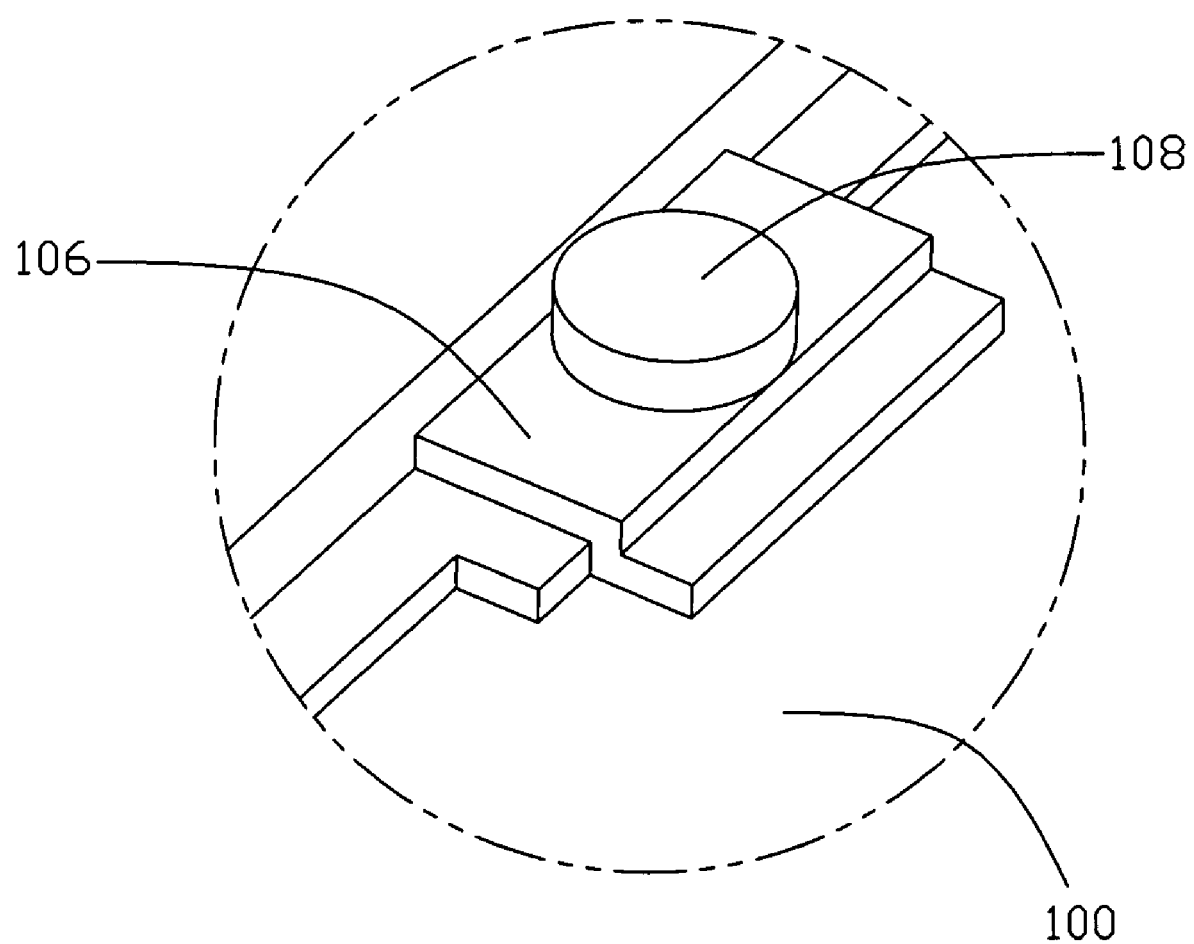
FIG. 3 is an enlarged perspective view of the X portion shown in FIG. 2.
Figure 4:
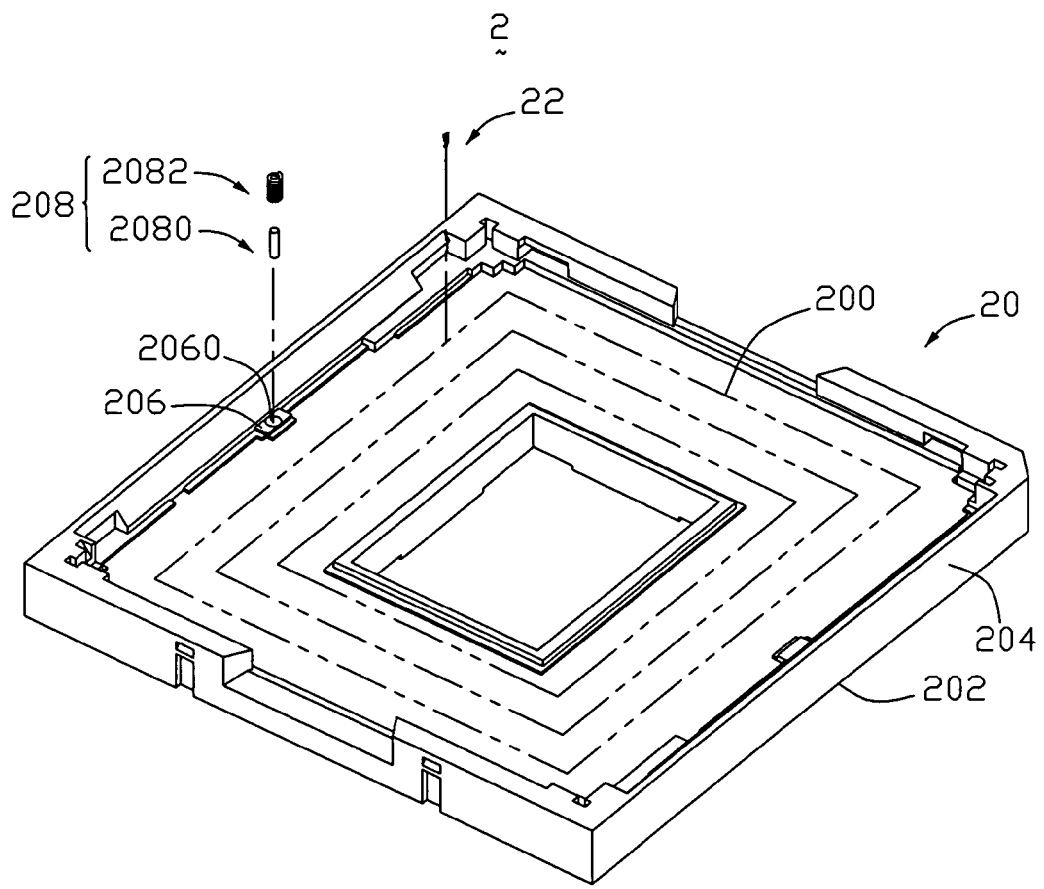
FIG. 4 is an exploded, perspective view of an electrical connector in accordance with a second preferred embodiment of the present invention.
Figure 5:
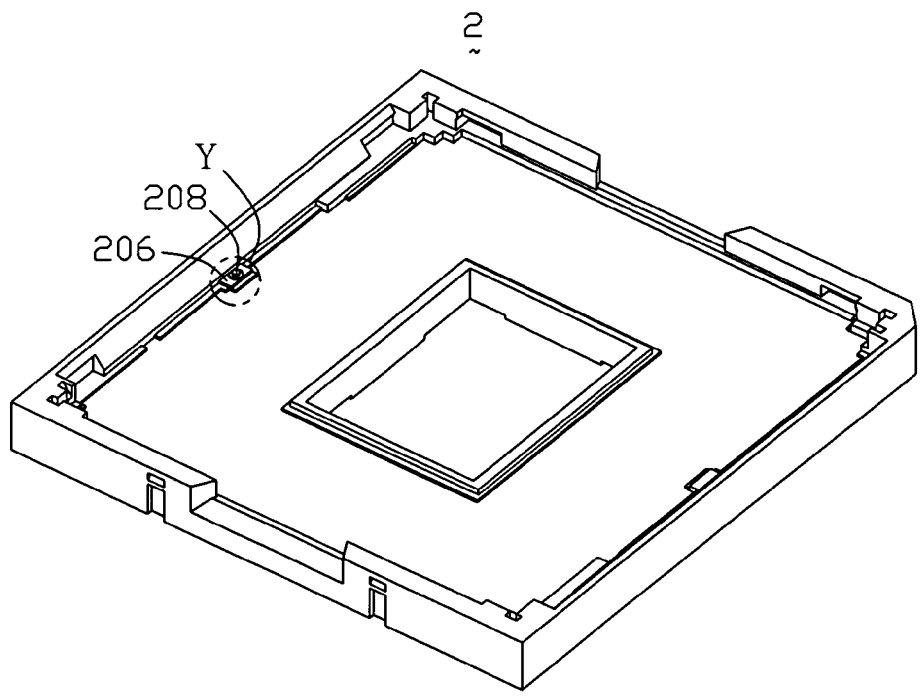
FIG. 5 is an assembled view of an electrical connector in accordance with a second preferred embodiment of the present invention.
Figure 6:
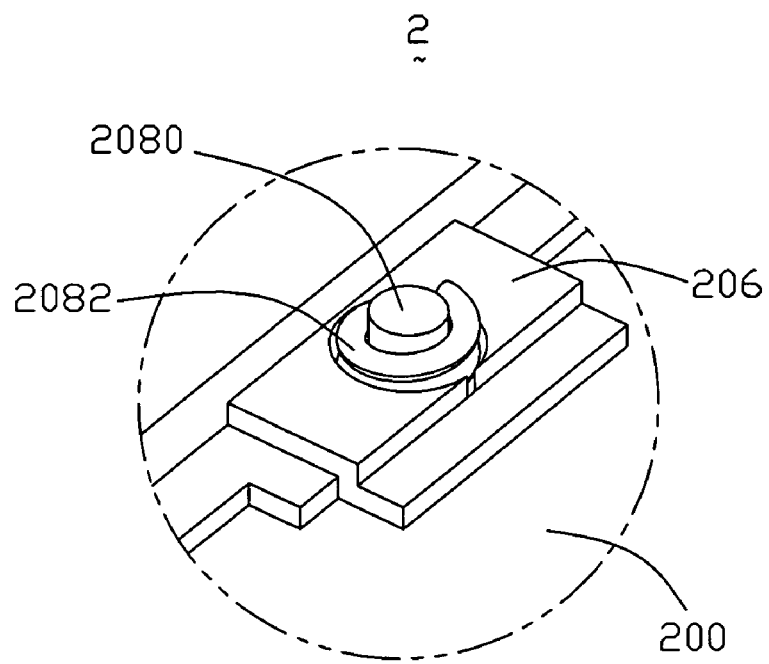
FIG. 6 is an enlarged perspective view of the Y portion shown in FIG. 5.
Figure 7:
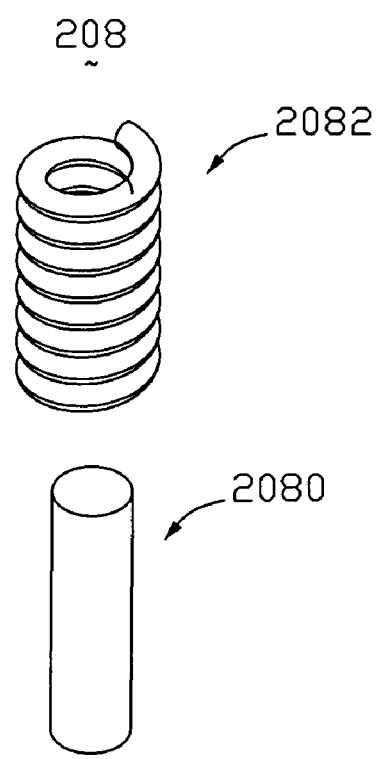
FIG. 7 is a perspective view of the auxiliary supporting standoff of FIG. 4.
Figure 8:
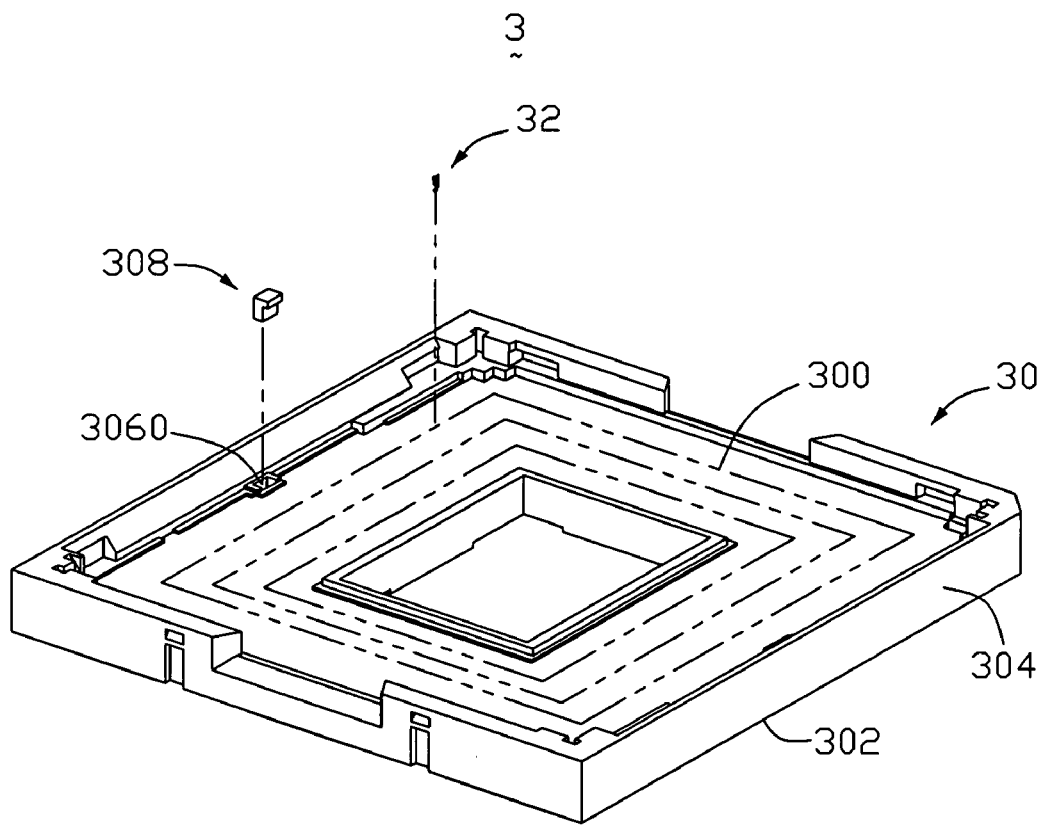
FIG. 8 is an exploded, perspective view of an electrical connector in accordance with a third preferred embodiment of the present invention.
Figure 9:
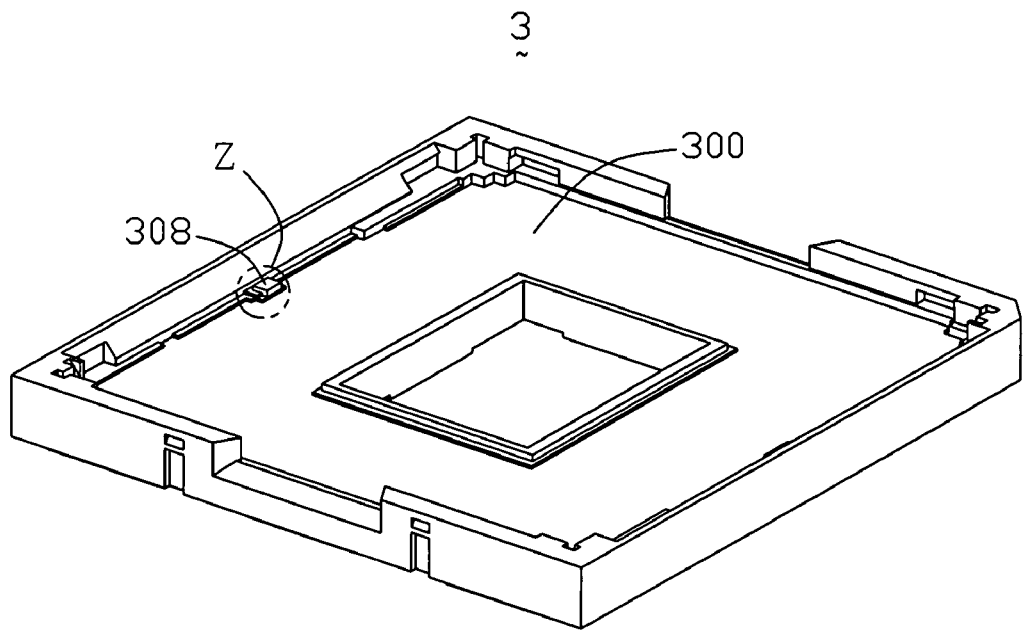
FIG. 9 is an assembled view of an electrical connector in accordance with a third preferred embodiment of the present invention.
Figure 10:
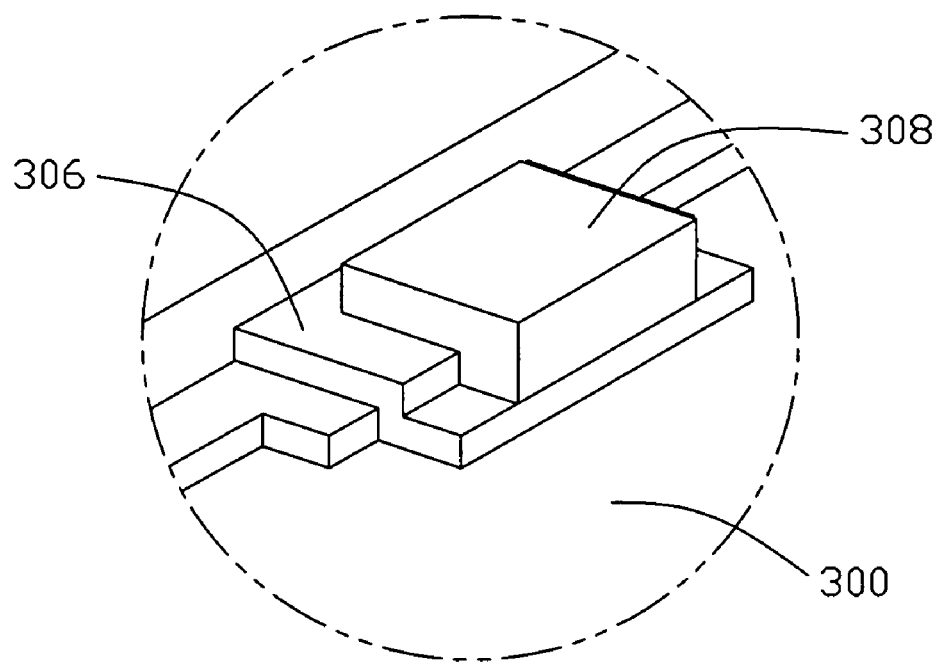
FIG. 10 is an enlarged perspective view of the Z portion shown in FIG. 9.
Figure 11:
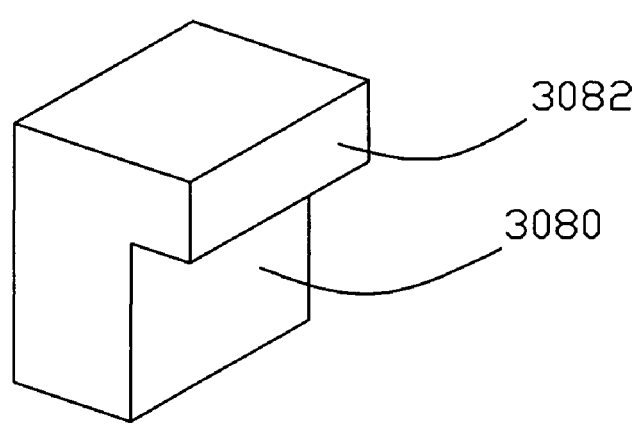
FIG. 11 is a perspective view of the auxiliary supporting standoff of FIG. 8.
Figure 12:
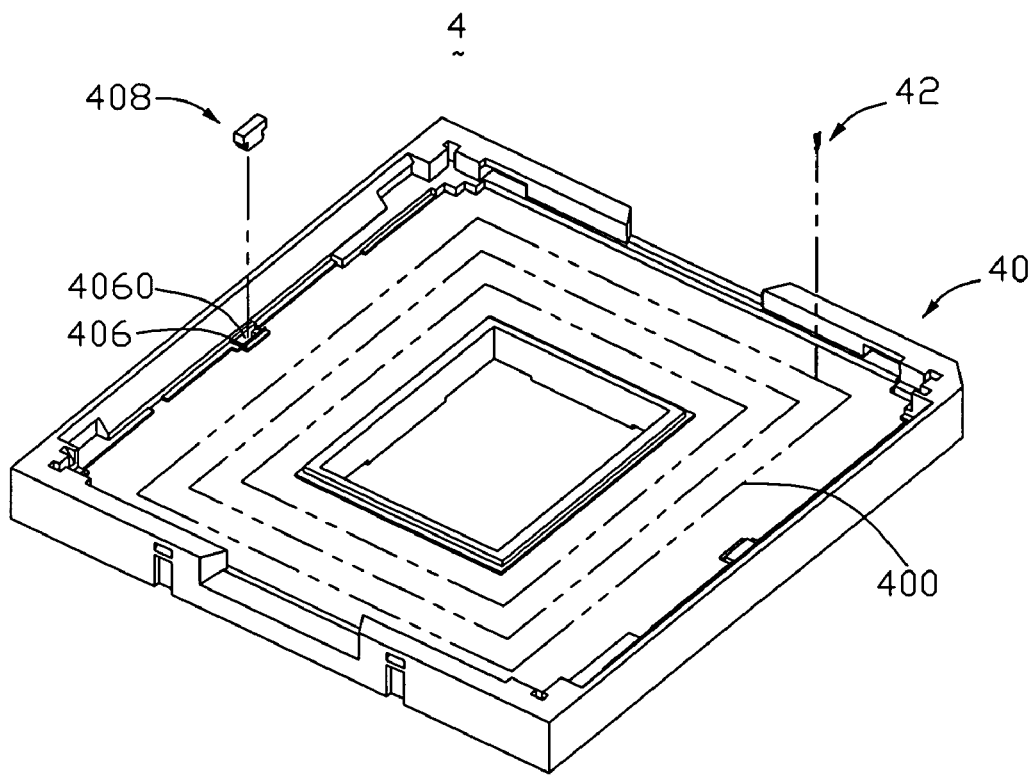
FIG. 12 is an exploded, perspective view of an electrical connector in accordance with a fourth preferred embodiment of the present invention.
Figure 13:
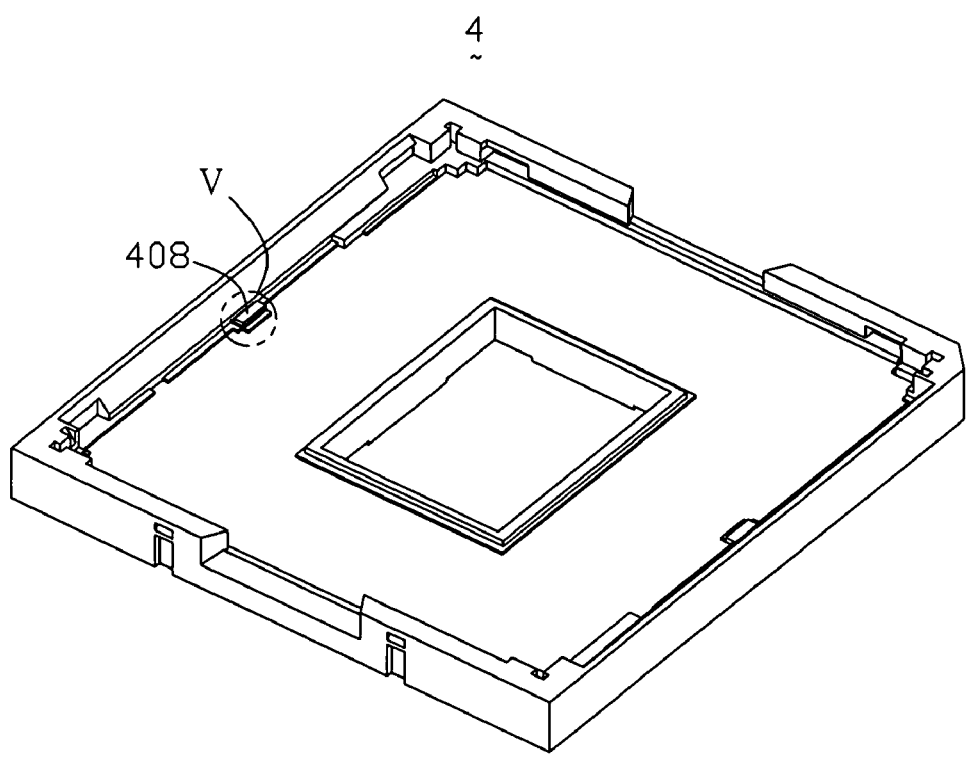
FIG. 13 is an assembled view of an electrical connector in accordance with a fourth preferred embodiment of the present invention.
Figure 14:
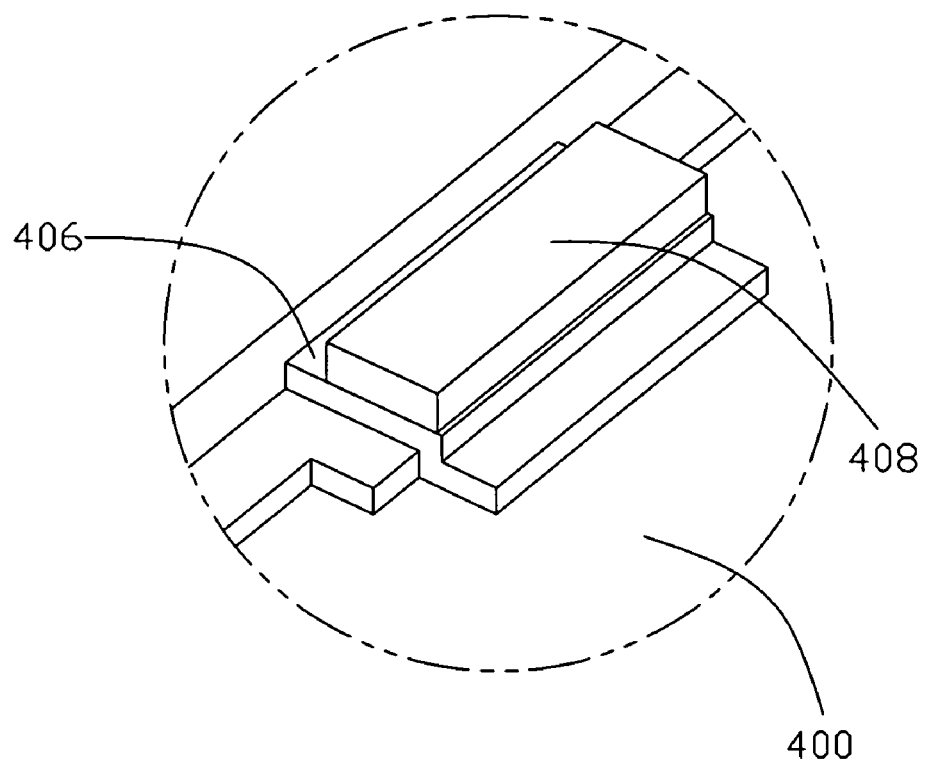
FIG. 14 is an enlarged perspective view of the V portion shown in FIG. 13.
Figure 15:
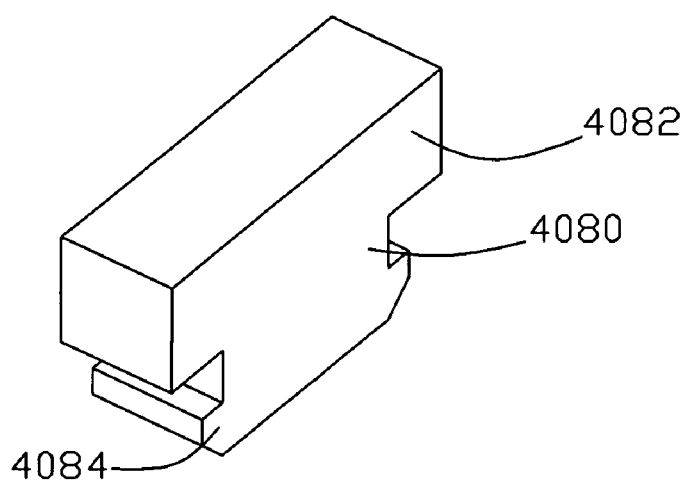
FIG. 15 is a perspective view of the auxiliary supporting standoff of FIG. 12.

Referring to FIGS. 1-3, an LGA type electrical connector 1 for establishing electrical connection between an IC module and a PCB according to the present invention is shown. The electrical connector 1 comprises an insulative housing 10 and a set of electrical contacts 12 receiving in the insulative housing 10.

The insulative housing 10 has a mating surface 100 for mating with an IC module (not shown) and a mounting surface 102 opposite to the mating surface 100 be able to be mounted onto a PCB. Peripheral walls 104 extend upwardly from the mating surface 100, so as to form a receiving cavity adapted to have the IC module received therein together with the mating surface 100.

The mating surface 100 defines a set of passageways (not labeled) on a certain region thereof. The set of electrical contacts 12 is receiving in corresponding passageways, respectively. A supporting block 106 is disposed on the mating surface 100 and arranged in a region of the mating surface 100 that is between the peripheral walls 104 and region occupied by the set of contacts 12.

As known to all, an electrical contact complying with an LGA type electrical connector generally comprises a resilient arm extending above the mating surface. The resilient arm will exert a resistive force on the IC module, e.g. CPU module, when the IC module is pressed downwardly. The resistive force typically has normal and tangential components. The normal force is usually making a tight contact between the IC module and the electrical contacts.

However, electrical contacts of LGA type electrical connector have a problem. That is, the resilient arms of the electrical contact will be deflected during mating. Thus, the resilient arms are easily under a condition of excessive deflection when the pressure from the IC module is too big because of incorrectly operation or other reasons. To resolve the depicted problem, the supporting block is designed to distribute the pressure from the IC module and prevent the contact from excessive deformation under said pressure.

However, though the supporting block is provided to distribute the pressure from the IC module, damaged risk of electrical contacts also exist in using process. Applicant studied this issue and found that is because the supporting block is usually integrated formed with the insulative housing by art of injected. Thus, most supporting blocks have limited strength and will be damaged if the pressure from the IC module is too big, and the electrical contact will be damaged too.

The present invention wants to provide an LGA type electrical connector having a reinforced supporting block.

As depicted above, the supporting block 106 further defines a supporting plane (not labeled) on top thereof for supporting the IC module. The supporting plane defines a receiving hole 1060 configured to accommodate an auxiliary supporting standoff, or a reinforced element 108. The auxiliary supporting standoff 108 may be rigid member or non-rigid member. The auxiliary supporting standoff 108 is attaché to the supporting block 106, so as to reinforce the intensity of the supporting block 106.

In the first preferred embodiment, the auxiliary supporting standoff 108 is a rigid member and generally of a cylinder shape. The auxiliary supporting standoff 108 is disposed above the supporting plane. It is noted that, the auxiliary supporting standoff 108 also may be disposed below or substantially flush to the supporting plane.

Referring to FIGS. 4-7, an LGA type electrical connector 2 for establishing electrical connection between an IC module and a PCB in accordance with the second embodiment of the present invention is shown. The electrical connector 2 comprises an insulative housing 20 and a set of electrical contacts 22 receiving in the insulative housing 20.

The insulative housing 20 has a mating surface 200 for mating with an IC module (not shown) and a mounting surface 202 opposite to the mating surface 200 be able to be mounted onto a PCB. Peripheral walls 204 extend upwardly from the mating surface 200, so as to form a receiving cavity adapted to have the IC module received therein together with the mating surface 200.

The mating surface 200 defines a set of passageways (not labeled) on a certain region thereof. The set of electrical contacts 22 is receiving in corresponding passageways, respectively. A supporting block 206 is disposed on the mating surface 200 and arranged in a region of the mating surface 200 that is between the peripheral walls 204 and region occupied by the set of contacts 22.

As depicted above, the supporting block 206 further defines a supporting plane (not labeled) on top thereof for supporting the IC module. The supporting plane defines a receiving hole 2060 configured to accommodate an auxiliary supporting standoff 208. The auxiliary supporting standoff 208 may be rigid member or non-rigid member. The auxiliary supporting standoff 208 is defined in the supporting block 206, so as to reinforce the strength of the supporting block 206.

In the second preferred embodiment, the auxiliary supporting standoff 208 is a hybrid member; comprising a rigid post 2080 and a metal spring 2082 surrounding said post 2080. The auxiliary supporting standoff 208 is disposed above the supporting plane. It is noted that, the auxiliary supporting standoff 208 also may be disposed below or substantially flush to the supporting plane. Specially, the rigid post 208 could be disposed below the supporting plane, while the spring is disposed above the supporting plane because of its good elasticity. By above manner, strength of the supporting block 206 is increased.

Referring to FIGS. 8-11, an LGA type electrical connector 3 for establishing electrical connection between an IC module and a PCB in accordance with the third embodiment of the present invention is shown. The electrical connector 3 comprises an insulative housing 30 and a set of electrical contacts 32 receiving in the insulative housing 30.

The insulative housing 30 has a mating surface 300 for mating with an IC module (not shown) and a mounting surface 302 opposite to the mating surface 300 be able to be mounted onto a PCB. Peripheral walls 304 extend upwardly from the mating surface 300, so as to form a receiving cavity adapted to have the IC module received therein together with the mating surface 300.

The mating surface 300 defines a set of passageways (not labeled) on a certain region thereof. The set of electrical contacts 32 is receiving in corresponding passageways, respectively. A supporting block 306 is disposed on the mating surface 300 and arranged in a region of the mating surface 300 that is between the peripheral walls 304 and region occupied by the set of contacts 32.

As depicted above, the supporting block 306 further defines a supporting plane (not labeled) on top thereof for supporting the IC module. The supporting plane defines a groove 3060 configured to accommodate an auxiliary supporting standoff 308. The auxiliary supporting standoff 308 may be rigid member or non-rigid member. The auxiliary supporting standoff 308 is defined in the supporting block 306, so as to reinforce the strength of the supporting block 306.

In the third preferred embodiment, the auxiliary supporting standoff 308 comprises a mounting portion 3080 receiving in the groove 3060 and a supporting portion 3082 connecting with the mounting portion 3080. The supporting portion 3082 is disposed on top of the mounting portion 3080 and extends upwardly therefrom. The auxiliary supporting standoff 308 is disposed above the supporting plane. Similarly, the auxiliary supporting standoff 308 may be disposed below or substantially flush to the supporting plane because aim of the auxiliary supporting standoff 308 is to increase strength of the supporting block 206.

Referring to FIGS. 12-15, an LGA type electrical connector 4 for establishing electrical connection between an IC module and a PCB in accordance with the third embodiment of the present invention is shown. The electrical connector 4 comprises an insulative housing 40 and a set of electrical contacts 42 receiving in the insulative housing 40.

The insulative housing 40 has a mating surface 400 for mating with an IC module (not shown) and a mounting surface 402 opposite to the mating surface 400 be able to be mounted onto a PCB. Peripheral walls (not labeled) extend upwardly from the mating surface 400, so as to form a receiving cavity adapted to have the IC module received therein together with the mating surface 400.

The mating surface 400 defines a set of passageways (not labeled) on a certain region thereof. The set of electrical contacts 42 is receiving in corresponding passageways, respectively. A supporting block 406 is disposed on the mating surface 400 and arranged in a region of the mating surface 400 that is between the peripheral walls and region occupied by the set of contacts 42.

As depicted above, the supporting block w406 further defines a supporting plane (not labeled) on top thereof for supporting the IC module. The supporting plane defines a groove 4060 configured to accommodate an auxiliary supporting standoff 408. The auxiliary supporting standoff 408 may be rigid member or non-rigid member. The auxiliary supporting standoff 408 is defined in the supporting block 406, so as to reinforce the strength of the supporting block 406.

In the fourth preferred embodiment, the auxiliary supporting standoff 408 comprises a mounting portion 4080 receiving in the groove 4060 and a supporting portion 4082 connecting with the mounting portion 4080. The supporting portion 4082 extends from one side of the mounting portion 408 toward the receiving cavity.

In a word, each of the supporting blocks 106,206,306,406 is different from a supporting block of a conventional LGA electrical connector. Each of the supporting blocks of the present invention is a hybrid member, comprising a basic supporting block and an auxiliary supporting standoff defined in the basic supporting block.

Although the present invention has been described with reference to the accompanying drawings, it is not to be construed as being limited thereto. Various alterations and modifications can be made to the embodiments without in any way departing from the scope or spirit of the present invention as defined in the appended claims. Such modifications and alterations that may be apparent to a person skilled in the art are intended to be included within the scope of this invention as defined in by the accompanying claims.

What is claimed is:

1. An electrical connector for establishing electrical connection between an IC module and a PCB, comprising:
   an insulative housing, having a mating surface and a mounting surface opposite thereto;
   a set of passageways arranged on a certain region of the mating surface;
   a set of electrical contacts receiving in corresponding passageways;
   a supporting block extending upwardly from said mating surface and defining a supporting plane adapted for supporting the IC module; and
   a reinforced clement attached to the supporting block to reinforce said supporting block; and
   wherein the reinforced element is not disposed above the supporting plane.

2. The electrical connector as claimed in claim 1, wherein the reinforced element is a metal spring, and wherein the metal spring is below the supporting plane.

3. The electrical connector as claimed in claim 1, wherein the reinforced element is a rigid metal member.

4. The electrical connector as claimed in claim 1, the supporting plane defining a receiving hole adapted for accommodating the reinforced element, wherein a supporting standoff comprises a rigid post and a metal spring surrounding said post.

5. The electrical connector as claimed in claim 1, said supporting plane having a groove thereof; wherein said reinforced element comprises a mounting portion receiving in the groove and a supporting portion connecting with the mounting portion.

6. The electrical connector as claimed in claim 5, wherein the supporting portion is disposed on the top of the mounting portion and extending upwardly.

7. The electrical connector as claimed in claim 5, wherein the supporting portion extends from one side of the mounting portion toward the receiving cavity.

8. The electrical connector as claimed in claim 1, wherein peripheral walls extend upwardly from the mating surface and form a receiving cavity together with the mating surface, said supporting block arranged on a region of the mating surface, which is between the peripheral walls and a region occupied by the contacts.

9. An electrical connector for establishing electrical connection between an IC module and a PCB, comprising:
   an insulative housing, having a mating surface and peripheral walls extending therefrom, so as to form a received cavity adapted to have an IC module receiving therein; and
   a hybrid supporting standoff disposed on the mating surface and in the region of the receiving cavity; wherein
   the hybrid supporting standoff comprises a basic supporting block and a auxiliary supporting standoff attached to the supporting block; and
   wherein the basic supporting block is internal formed with the insulative housing and defines a supporting plane on top thereof;
   wherein the supporting plane defines a receiving hole configured to have the auxiliary supporting standoff, and the auxiliary supporting standoff is also a hybrid member, comprising a rigid post and a metal spring surrounding the rigid post.

10. The electrical connector as claimed in claim 9, wherein the auxiliary supporting standoff is disposed above the supporting plane.

11. The electrical connector as claimed in claim 9, wherein the auxiliary supporting standoff is disposed substantially flush to the supporting plane.

12. The electrical connector as claimed in claim 9, wherein both the post and the spring are not above the supporting plane.

13. The electrical connector as claimed in claim 9, wherein the post is disposed below the supporting plane, and the spring is disposed above the supporting plane.

14. An electrical connector comprising:
   an insulative housing including a plurality of side walls surrounding a base all commonly defining an upward receiving cavity for receiving an electronic package therein;
   at least one supporting standoff unitarily formed on and upward protruding above the base around one of said walls in said receiving cavity;

an auxiliary element being attached to the supporting standoff and adding strength to the supporting standoff under a condition that at least one of said supporting standoff and said auxiliary element provides an upward abutment surface adapted to be directly seated upon by said electronic package when assembled.

* * * * *